United States Patent
Tian et al.

(10) Patent No.: US 10,930,191 B2
(45) Date of Patent: Feb. 23, 2021

(54) DISPLAY DRIVING CIRCUIT AND DRIVING METHOD THEREFOR, DISPLAY DEVICE

(71) Applicants: Chongqing BOE Optoelectronics Technology Co., Ltd., Chongqing (CN); BOE TECHNOLOGY GROUP CO., LTD., Beijing (CN)

(72) Inventors: Zhenguo Tian, Beijing (CN); Shuang Hu, Beijing (CN); Lijun Xiong, Beijing (CN); Shuai Chen, Beijing (CN); Taoliang Tang, Beijing (CN); Xing Dong, Beijing (CN); Xuebo Liang, Beijing (CN); Zhi Zhang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/610,999

(22) PCT Filed: Nov. 5, 2018

(86) PCT No.: PCT/CN2018/114004
§ 371 (c)(1),
(2) Date: Nov. 5, 2019

(87) PCT Pub. No.: WO2019/184355
PCT Pub. Date: Oct. 3, 2019

(65) Prior Publication Data
US 2020/0082747 A1    Mar. 12, 2020

(30) Foreign Application Priority Data
Mar. 26, 2018 (CN) .................. 201810252721.X

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2310/0286* (2013.01); *G09G 2310/08* (2013.01)

(58) Field of Classification Search
CPC .......... G09G 3/20; G09G 3/36; G09G 3/3674; G09G 3/3677; G09G 2310/0267;
(Continued)

(56) References Cited

U.S. PATENT DOCUMENTS 9,406,282 B2    8/2016  Gomez et al.
10,547,316 B2 * 1/2020 Takasugi ................ H03K 21/18
(Continued)

FOREIGN PATENT DOCUMENTS

| CN | 105609067 A | 5/2016 |
| CN | 105913822 A | 8/2016 |

(Continued)

OTHER PUBLICATIONS

International Search Report and Written Opinion issued in corresponding International Patent Application No. PCT/CN2018/114004, dated Jan. 30, 2019, with English translation.
(Continued)

*Primary Examiner* — Michael J Eurice
(74) *Attorney, Agent, or Firm* — McDermott Will and Emery LLP

(57) ABSTRACT

A display driving circuit includes a control sub-circuit and a gate drive sub-circuit connected to the control sub-circuit. The control sub-circuit is configured to: receive an effective display data enable signal; determine whether the effective display data enable signal is lost; and control each stage of shift register in the gate drive sub-circuit to output a dis-
(Continued)

abling signal via an output terminal of the shift register in response to determining that the effective display data enable signal is lost.

17 Claims, 6 Drawing Sheets

(58) Field of Classification Search
CPC ..... G09G 2310/0286; G09G 2310/066; G09G 2310/08; G09G 2320/02; G11C 19/28
See application file for complete search history.

(56) References Cited

U.S. PATENT DOCUMENTS

| | | | | |
|---|---|---|---|---|
| 10,657,879 B1* | 5/2020 | Gu | ............... | G09G 3/2096 |
| 2005/0168491 A1* | 8/2005 | Takahara | ............ | G09G 3/3241 |
| | | | | 345/690 |
| 2005/0248971 A1* | 11/2005 | Lee | ................ | G09G 5/006 |
| | | | | 365/63 |
| 2007/0296662 A1* | 12/2007 | Lee | ................ | G09G 3/3677 |
| | | | | 345/87 |
| 2007/0297559 A1* | 12/2007 | Cho | ................ | G09G 3/3677 |
| | | | | 377/64 |
| 2008/0136756 A1* | 6/2008 | Yeo | ................ | G09G 3/3677 |
| | | | | 345/87 |
| 2009/0096769 A1* | 4/2009 | Kim | ................ | G09G 3/2096 |
| | | | | 345/204 |
| 2010/0134399 A1* | 6/2010 | Ki | ................ | G11C 19/28 |
| | | | | 345/94 |
| 2011/0148846 A1* | 6/2011 | Arasawa | ............ | G09G 3/3614 |
| | | | | 345/212 |
| 2011/0199365 A1* | 8/2011 | Umezaki | ............ | H01L 27/088 |
| | | | | 345/212 |
| 2011/0291712 A1* | 12/2011 | Tobita | .............. | G09G 3/3677 |
| | | | | 327/144 |
| 2012/0162185 A1* | 6/2012 | Park | ................ | G09G 3/3611 |
| | | | | 345/212 |
| 2015/0187313 A1* | 7/2015 | Lee | ................ | G09G 3/3674 |
| | | | | 345/100 |
| 2015/0332632 A1* | 11/2015 | Nakata | .............. | G06K 9/0051 |
| | | | | 345/690 |
| 2016/0133337 A1* | 5/2016 | Gu | ................ | G09G 3/00 |
| | | | | 377/64 |
| 2017/0154600 A1* | 6/2017 | Lee | ................ | G09G 3/2092 |
| 2017/0193885 A1* | 7/2017 | Feng | .............. | G11C 19/184 |
| 2017/0213499 A1* | 7/2017 | Kong | .............. | G11C 19/28 |
| 2017/0269769 A1* | 9/2017 | Hu | ................ | G11C 19/28 |
| 2018/0005564 A1 | 1/2018 | Xie et al. | | |
| 2018/0261178 A1* | 9/2018 | Shao | ................ | G09G 3/3677 |
| 2018/0337682 A1* | 11/2018 | Takasugi | ............. | G09G 3/3241 |
| 2019/0027079 A1 | 1/2019 | Shang et al. | | |
| 2019/0114951 A1* | 4/2019 | Li | ................ | G11C 19/28 |
| 2019/0172843 A1* | 6/2019 | Yoshida | ............. | G09G 3/3677 |
| 2019/0214104 A1* | 7/2019 | Qian | ................ | G11C 19/28 |
| 2020/0035184 A1* | 1/2020 | Luo | ................ | G09G 3/3677 |
| 2020/0042153 A1* | 2/2020 | Yang | ................ | G09G 3/20 |
| 2020/0066209 A1* | 2/2020 | Zhang | .............. | G11C 19/28 |
| 2020/0082747 A1* | 3/2020 | Tian | ................ | G09G 3/20 |
| 2020/0135287 A1* | 4/2020 | Han | ................ | G09G 3/3266 |

FOREIGN PATENT DOCUMENTS

| | | |
|---|---|---|
| CN | 106228944 A | 12/2016 |
| CN | 106910478 A | 6/2017 |
| CN | 107516500 A | 12/2017 |
| CN | 107731190 A | 2/2018 |
| CN | 108492791 A | 9/2018 |

OTHER PUBLICATIONS

First Office Action issued in corresponding Chinese Patent Application No. 201810252721.X, dated Apr. 28, 2019, with English translation.

* cited by examiner

DISPLAY DRIVING CIRCUIT AND DRIVING METHOD THEREFOR, DISPLAY DEVICE

CROSS-REFERENCE TO RELATED APPLICATIONS

This application is a national phase entry under 35 USC 371 of International Patent Application No. PCT/CN2018/114004 filed on Nov. 5, 2018, which claims priority to Chinese Patent Application No. 201810252721.X, filed with the Chinese Patent Office on Mar. 26, 2018, titled "DISPLAY DRIVING CIRCUIT AND METHOD OF CONTROLLING THE SAME, DISPLAY APPARATUS", which are incorporated herein by reference in their entirety.

TECHNICAL FIELD

The present disclosure relates to the field of display technologies, and in particular, to a display driving circuit and a method of controlling the same, and a display apparatus.

BACKGROUND

In the display process of a display apparatus, such as a thin film transistor liquid crystal display (TFT-LCD) apparatus, a timing controller (TCON) provides clock signals (CLK) to a gate drive circuit to enable the gate drive circuit to gate the gate lines row by row.

SUMMARY

Some embodiments of the present disclosure provide a display driving circuit, and the display driving circuit includes a control sub-circuit and a gate drive sub-circuit connected to the control sub-circuit. The control sub-circuit is configured to receive an effective display data enable signal; determine whether the effective display data enable signal is lost; and control each stage of shift register in the gate drive sub-circuit to output a disabling signal via an output terminal of the shift register in response to determining that the effective display data enable signal is lost.

In some embodiments, the control sub-cricuit includes a signal determining component, an instruction generating component connected to the signal determining component, and a trigger component connected to the instruction generating component. The trigger component is further connected to a total reset terminal connected to each stage of shift register in the gate drive sub-circuit. The signal determining component is configured to determine whether the effective display data enable signal is lost. The instruction generating component is configured to receive a determination result from the signal determining component, and generate the first signal adjustment instruction in response to the signal determining component determining that the effective display data enable signal is lost. The trigger component is configured to provide a first enable signal to the total reset terminal connected to the shift register in the gate drive sub-circuit according to the first signal adjustment instruction. The shifter register is configured to output the disabling signal via an output terminal of the shifter register under control of the first enable signal.

In some embodiments, the shifter register includes a first reset transistor. A gate of the first reset transistor is connected to the total reset terminal, a first electrode of the first reset transistor is connected to the output terminal, and a second electrode of the first reset transistor is connected to a first voltage terminal. The first reset transistor is configured to transmit the disabling signal received by the first voltage terminal to the output terminal under control of the first enable signal.

Based on this, in some embodiments, the shifter register further includes a second reset transistor and a driving transistor. A gate of the second reset transistor is connected to the total reset terminal, a first electrode of the second reset transistor is connected to a pull-up node in the shifter register, and a second electrode of the second reset transistor is connected to the first voltage terminal. A gate of the driving transistor is connected to the pull-up node. The second reset transistor is configured to transmit the disabling signal received by the first voltage terminal to the pull-up node under the control of the first enable signal. The driving transistor is configured to be turned off under control of the disabling signal from the pull-up node.

In some embodiments, the control circuit includes a timing controller and a level shifter connected to the timing controller. The instruction generating component is further configured to generate a second signal adjustment instruction in response to the signal determining component determining that the effective display data enable signal is not lost. The timing controller is configured to receive the effective display data enable signal, and output a plurality of initial clock signals to the level shifter according to the effective display data enable signal. The level shifter is configured to convert the plurality of initial clock signals into a plurality of first effective clock signals according to the second signal adjustment instruction, and an amplitude of each of the plurality of initial clock signals is less than an amplitude of each converted first effective clock signal.

In some embodiments, the level shifter is configured to convert the plurality of initial clock signals into a medium voltage signal, and then convert the medium voltage signal into the plurality of first effective clock signals, an amplitude of the medium voltage signal is greater than a minimum amplitude of the first effective clock signals, and less than a maximum amplitude of the first effective clock signals.

In some embodiments, the control sub-circuit includes a timing controller and a level shifter connected to the timing controller. The timing controller is configured to receive the effective display data enable signal, and output a plurality of initial clock signals to the level shifter according to the effective display data enable signal. The level shifter is configured to convert the plurality of initial clock signals into a plurality of second effective clock signals.

In some embodiments, the signal determining component, the instruction generating component, and the trigger component are integrated in the timing controller.

In another aspect of embodiments of the present disclosure, a method of controlling any one of the display driving circuits as described above is provided, and the method includes: receiving, by the control sub-circuit, the effective display data enable signal; determining, by the control sub-circuit, whether the effective display data enable signal is lost; and controlling, by the control sub-circuit, each stage of shift register in the gate drive sub-circuit to output a disabling signal via an output terminal of the shift registering response to determining that the effective display data enable signal is lost.

In some embodiments, the control sub-circuit includes a timing controller, a level shifter, a signal determining component, an instruction generating component, and a trigger component.

Based on this, determining, by the control sub-circuit, whether the effective display data enable signal is lost and controlling each stage of shift register in the gate drive sub-circuit to output a disabling signal via an output terminal of the shift register in response to determining that the effective display data enable signal is lost, includes:

determining, by the signal determining component, whether the effective display data enable signal is continuously a low level for at least one period; maintaining, by the level shifter, a charge sharing operation if the signal determining component determines that the effective display data enable signal is continuously a low level for at least one period, and converting, by the level shifter, each of the plurality of initial clock signals output by the timing controller to a medium voltage, which is greater than a trough voltage of each effective clock signal and less than a crest voltage of the effective clock signal; generating, by the instruction generating component, the first signal adjustment instruction, and providing, by the trigger component, a first enable signal to a total reset terminal connected to each stage of shift register in the gate drive sub-circuit according to the first signal adjustment instruction; and pulling down a voltage at the output terminal of the shift register to a first voltage terminal used to output a low level, under control of the first enable signal from the total reset terminal.

In some embodiments, the shift register includes a first reset transistor. A gate of the first reset transistor is connected to the total reset terminal, a first electrode of the first reset transistor is connected to the output terminal of the shift register, and a second electrode of the first reset transistor is connected to the first voltage terminal.

Based on this, pulling down a voltage at the output terminal of the shift register to a first voltage terminal used to output a low level, under the control of the first enable signal from the total reset terminal, includes: turning on the first reset transistor under the control of the first enable signal from the total reset terminal, so that the output terminal of the shift register is electrically connected to the first voltage terminal.

In some embodiments, the shift register further includes a second reset transistor. A gate of the second reset transistor is connected to the total reset terminal, a first electrode of the second reset transistor is connected to a pull-up node in the shift register, and a second electrode of the second reset transistor is connected to the first voltage terminal.

Based on this, the method further includes: turning on the second reset transistor under the control of the first enable signal from the total reset terminal, so that the pull-up node is connected to the first voltage terminal.

In some embodiments, the control sub-circuit includes a timing controller, a level shifter, a signal determining component, an instruction generating component, and a trigger component.

Based on this, determining, by the control sub-circuit, whether the effective display data enable signal is lost, and controlling, by the control sub-circuit, each stage of shift register in the gate drive sub-circuit to output a disabling signal via an output terminal of the shift register in response to determining that the effective display data enable signal is lost, includes:

determining, by the signal determining component, whether the effective display data enable signal is continuously a low level for at least one period; generating, by the instruction generating component, the first signal adjustment instruction, if the signal determining component determines that the effective display data enable signal is continuously a low level for at least one period; and controlling, by the trigger component, the level shifter to stop performing a charge sharing operation, according to the first signal adjustment instruction. Each of the plurality of effective clock signals provided by the level shifter to the gate drive sub-circuit is continuously a disabling signal for at least one period.

Based on this, the method further includes: generating, by the instruction generating component, a second signal adjustment instruction if the signal determining component determines that the effective display data enable signal is not continuously a low level for at least one period, and controlling, by the trigger component, the level shifter to perform a charge sharing operation according to the second signal adjustment instruction.

In some embodiments, controlling the level shifter to stop performing a charge sharing operation includes: receiving, by the charge sharing control terminal of the level shifter, a second enable signal, and stopping, by the level shifter, performing a charge sharing operation under control of the second enable signal from the charge sharing control terminal.

In some embodiments, after the effective display data enable signal is continuously a low level for at least one period, and when the effective display data enable signal is a square wave signal, the method further includes: outputting, by the control sub-circuit, a start signal to an input terminal of a first-stage shift register of the gate drive sub-circuit.

In some embodiments, the display driving circuit further includes a source drive sub-circuit connected to the timing controller. When the effective display data enable signal is continuously a low level for at least one period, the method further includes: outputting, by the timing controller, a data voltage for displaying a black image to the source drive sub-circuit.

Some embodiments of the present disclosure provide a computer device including a memory and a processor. The memory stores a computer program executable on the processor, and when the processor executes the computer program, any one of the above methods is implemented.

Some embodiments of the present disclosure provide a display apparatus including any one of the display driving circuit described above.

BRIEF DESCRIPTION OF THE DRAWINGS

In order to describe technical solutions in embodiments of the present disclosure or in the related art more clearly, the accompanying drawings to be used in the description of embodiments or the related art will be introduced briefly. Obviously, the accompanying drawings to be described below are merely some embodiments of the present disclosure, and a person of ordinary skilled in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
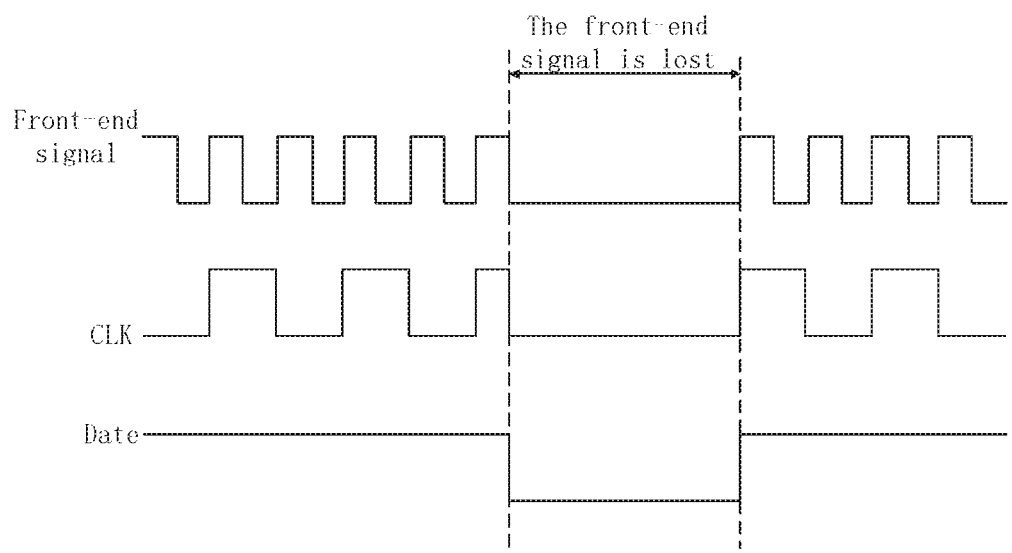
FIG. 1 is a timing diagram of signals provided by the related art.

The timing controller (TCON) generates a clock signal (CLK) according to a received front-end signal. As shown in FIG. 1, when the front-end signal is discontinuous, it will cause a signal loss of the CLK. In this case, the level shifter connected to the TCON converts a level of the CLK into an medium level, so that a gate line receiving the CLK is gated. However, in a case where the front-end signal is discontinuous, the source drive circuit no longer supplies data signals to the data line. In this way, a row of sub-pixels controlled by the gated gate line will be quickly discharged through the connected data lines, thereby resulting in a difference between the charges in the sub-pixels of this row and the charges in sub-pixels of several rows nearby, and further resulting in display defects such as display flash lines.

Figure 2A:
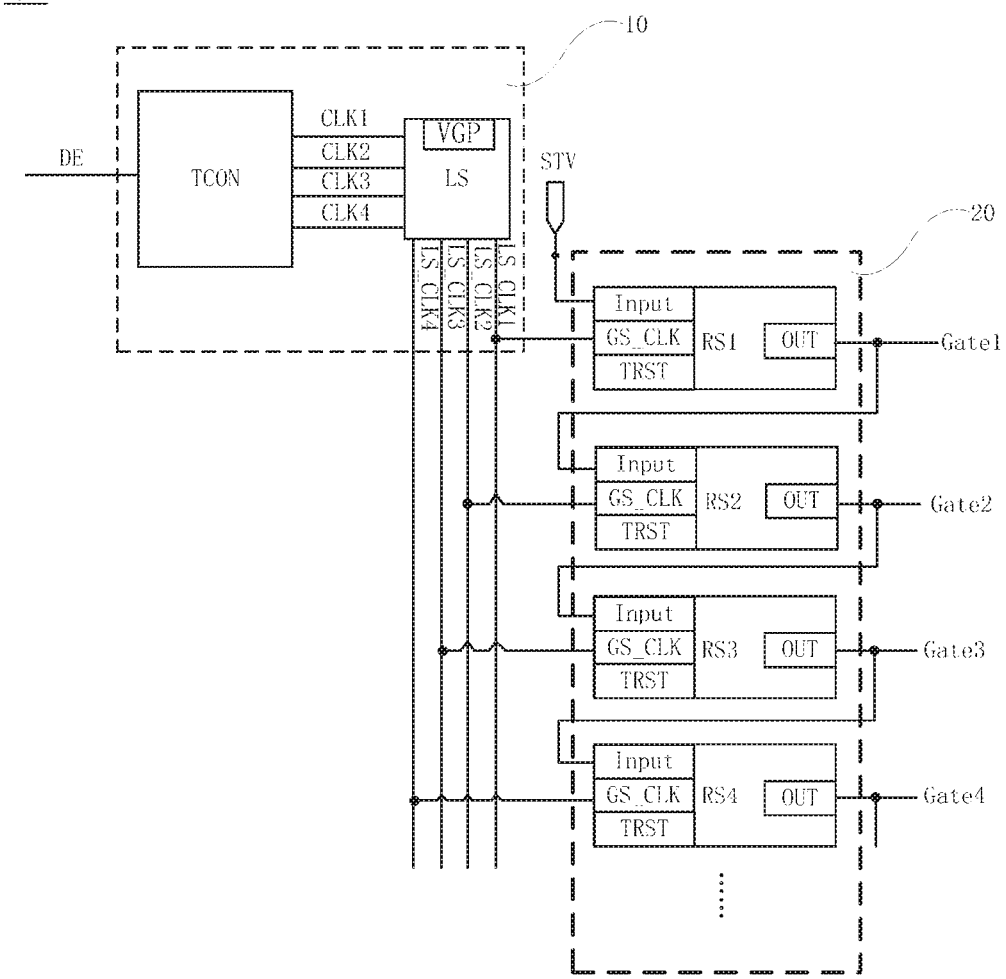
FIG. 2a is a schematic diagram showing a structure of a display driving circuit, in accordance with some embodiments of the present disclosure.

Some embodiments of the present disclosure provide a display driving circuit, and as shown in FIG. 2a, the display driving circuit includes a control sub-circuit 10 and a gate drive sub-circuit 20 connected to the control sub-circuit 10.

The control sub-circuit 10 is configured to receive an effective display data enable signal (DE) and provide a plurality of effective clock signals (GS_CLK1, GS_CLK2, GS_CLK3, GS_CLK4, . . . ) to the gate drive sub-circuit 20 according to the DE. In FIG. 2a, four effective clock signals (GS_CLK1, GS_CLK2, GS_CLK3, GS_CLK4) are illustrated, but the present disclosure is not limited thereto, and "a plurality of" in the present disclosure means two or more.

The control sub-circuit 10 is further configured to generate a first signal adjustment instruction in response to determining that the DE is lost, and control each stage of shift register (RS) in the gate drive sub-circuit 20 to output a disabling signal via an output terminal OUT of the stage of shift register according to the first signal adjustment instruction. In this case, a gate line (Gate) connected to the output terminal of the RS receives the disabling signal, thereby in a state of not being gated.

In some embodiments, the description that the control sub-circuit 10 determines that the DE is lost means that, if the control sub-circuit 10 determines that the DE is continuously a low-level signal for a predetermined period of time, then the control sub-circuit 10 determines that the DE is lost.

The predetermined period of time mentioned above may be set as needed. For example, the predetermined period of time may be at least one period of the DE.

It will be noted that, in the embodiments of the present disclosure, the disabling signal refers to a signal that causes the gate line that receives the disabling signal to be in a state of not being gated. The TFTs connected to the gate line that is not gated cannot be turned on through the gate line.

In some embodiments, the TFTs, which are connected to the gate lines, in the sub-pixels of the display apparatus are N-type, and when a gate of the TFT receives a low level through a gate line connected to the TFT, the TFT is turned off, and the gate line connected to the TFT is in a state of not being gated. In some other embodiments, the TFTs, which are connected to the gate lines, in the sub-pixels of the display apparatus are P-type, and when a gate of the TFT receives a high level through a gate line connected to the TFT, the TFT is turned off, and the gate line connected to the TFT is in a state of not being gated.

For convenience of description, the following embodiments are all described by taking an example in which the TFTs, which are connected to the gate lines, in the sub-pixels of the display apparatus are N-type. In this case, the disabling signal is a low-level signal VGL.

Figure 4:
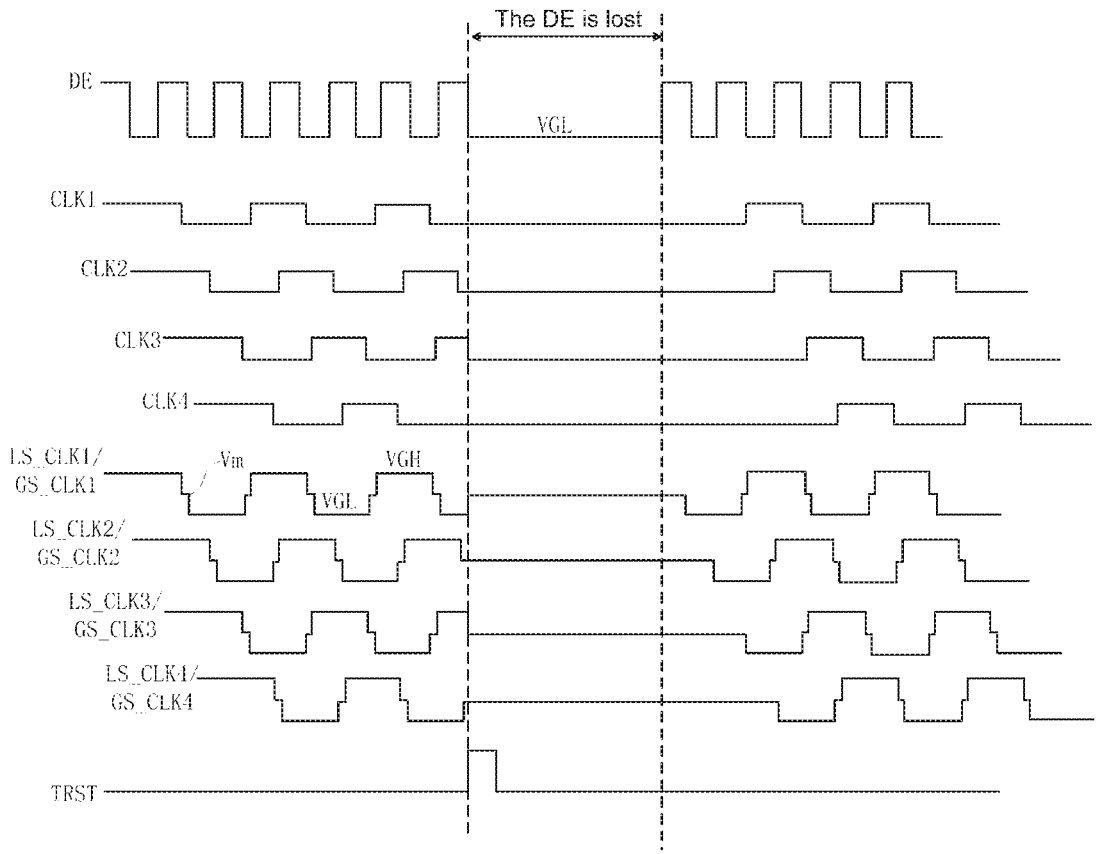
FIG. 4 is a timing diagram of signals involved in the S102 of FIG. 3.

In addition, as shown in FIG. 4, the troughs of the above effective clock signals (GS_CLK1, GS_CLK2, GS_CLK3, GS_CLK4, . . . ) are low levels VGL, and the crests are high levels VGH. The high level and the low level are relative concepts. In some embodiments, the low-level voltage is negative and the high-level voltage is positive. For example, the low-level voltage VGL may be −5V, and the high-level voltage VGH may be 5V. In some other embodiments, the low-level voltage and the high-level voltage are both positive. For example, the low-level voltage VGL is 5V and the high-level voltage VGH is 10V. In some embodiments, the voltages of the effective clock signals (GS_CLK1, GS_CLK2, GS_CLK3, GS_CLK4, . . . ) ranges from −8V to 32V.

In some embodiments, as shown in FIG. 2a, the control sub-circuit 10 includes a timing controller (TCON) and a level shifter (LS) connected to the TCON.

The TCON is configured to receive the DE and output a plurality of initial clock signals (CLK1, CLK2, CLK3, CLK4, . . . ) to the LS according to the DE.

In some embodiments, a voltage of each of the plurality of initial clock signals (CLK1, CLK2, CLK3, CLK4, . . . ) ranges from 0 to 2.5V.

The LS is configured to boost the voltage amplitude of each of the plurality of initial clock signals (CLK1, CLK2, CLK3, CLK4, . . . ), thereby converting the plurality of initial clock signals into the plurality of effective clock signals (GS_CLK1, GS_CLK2, GS_CLK3, GS_CLK4, . . . ). That is, the plurality of effective clock signals (GS_CLK1, GS_CLK2, GS_CLK3, GS_CLK4, . . . ) are in one-to-one correspondence with the plurality of initial clock signals (CLK1, CLK2, CLK3, CLK4, . . . ). The amplitude of each effective clock signal is greater than the amplitude of a corresponding initial clock signal.

In some embodiments, the LS is configured to perform a charge sharing operation to convert voltages of each of the plurality of initial clock signals (CLK1, CLK2, CLK3, CLK4, . . . ) to a medium voltage Vm. Then, the Vm corresponding to each of the initial clock signals is converted into voltages of an effective clock signal by, for example, a boost element to obtain the above plurality of effective clock signals (GS_CLK1, GS_CLK2, GS_CLK3, GS_CLK4, . . . ).

The voltage value of the medium voltage Vm is greater than that of the trough voltage VGL of the effective clock signal, and is less than that of the crest voltage VGH of the effective clock signal. For example, when the voltage of the effective clock signal is in the range from −8V to 32V, the medium voltage Vm may be approximately 15V.

In the process of normal display (i.e., the DE is not lost), the LS needs to convert the plurality of initial clock signals (CLK1, CLK2, CLK3, CLK4, . . . ) with a smaller amplitude into the plurality of effective clock signals (GS_CLK1, GS_CLK2, GS_CLK3, GS_CLK4 . . . ) with a larger amplitude. If each initial clock signal is directly converted into an effective clock signal, the difference of voltage amplitude between the initial clock signal and the effective clock signal is large, and thus power consumption required during the conversion process is large. Therefore, the LS can perform the charge sharing operation described above to first convert the crest voltage and the trough voltage of each initial clock signal to a medium voltage Vm. In this way, in a process of changing the crest voltage to the trough voltage, the voltage of each of the clock signals after the LS conversion (LS_CLK1, LS_CLK2, LS_CLK3, LS_CLK4, . . . ), i.e., the voltage of each of the plurality of effective clock signals (GS_CLK1, GS_CLK2, GS_CLK3, GS_CLK4, . . . ), is obtained by first converting the crest voltage into the medium voltage Vm, and then converting the medium voltage into the trough voltage VGL. In a process of changing the trough voltage to the crest voltage, the voltage of each of the clock signals after the LS conversion (LS_CLK1, LS_CLK2, LS_CLK3, LS_CLK4, . . . ), i.e., the voltage of each of the plurality of effective clock signals (GS_CLK1, GS_CLK2, GS_CLK3, GS_CLK4, . . . ), is obtained by first converting the trough voltage into the medium voltage Vm, and then converting the medium voltage into the crest voltage VGH. Thereby the variation magnitude of voltage is reduced, which is beneficial to reducing power consumption in the process of the voltage change.

As can be seen from the above, the control sub-circuit 10 may determine whether the DE is lost. For example, the control sub-circuit 10 determines whether the DE is continuously a low-level signal for at least one period. In a case where the control sub-circuit 10 determines that the DE is continuously a low-level signal for at least one period, it indicates that the DE is discontinuous, and the DE signal is lost. In this case, the control sub-circuit 10 generates the first signal adjustment instruction, and controls each stage of RS in the gate drive sub-circuit 20 to output a disabling signal, such as a low level VGL, via its output terminal OUT according to the first signal adjustment instruction. Based on this, since the low level VGL causes the gate line which should have been gated is not gated, TFTs connected to the gate line can not be turned on by the gate line. In this case, the charges on the pixel electrodes of a row of sub-pixels controlled by the gate line are not discharged through the data lines (Data), and thus the screen in the previous frame is kept for display. In this way, the charges that the sub-pixels of this row have are equivalent to the charges that the sub-pixels of several adjacent upper and lower rows have. Therefore, it may solve the problem of display defects such as display flash lines due to a large difference in charges that the sub-pixels of several adjacent rows have.

Hereinafter a structure of the control sub-circuit 10 will be described in detail.

Figure 2B:
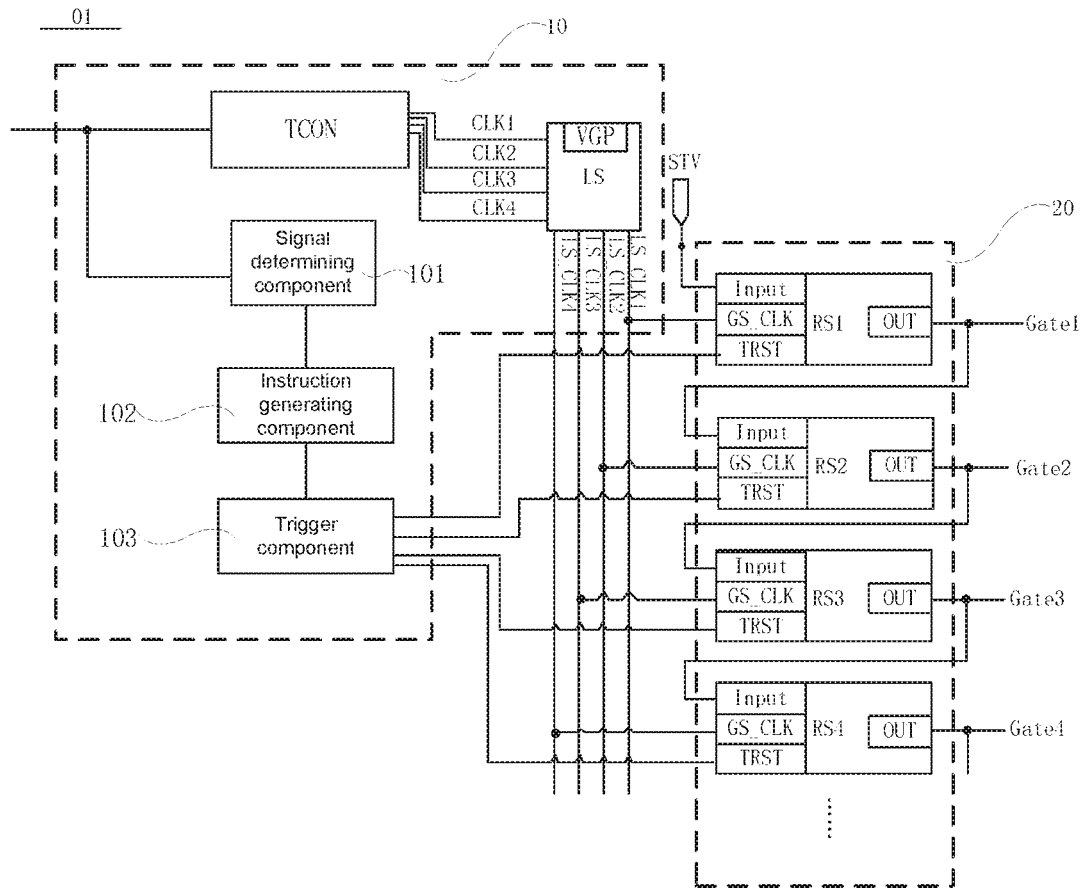
FIG. 2b is a schematic diagram showing a structure of another display driving circuit, in accordance with some embodiments of the present disclosure.
Figure 2C:
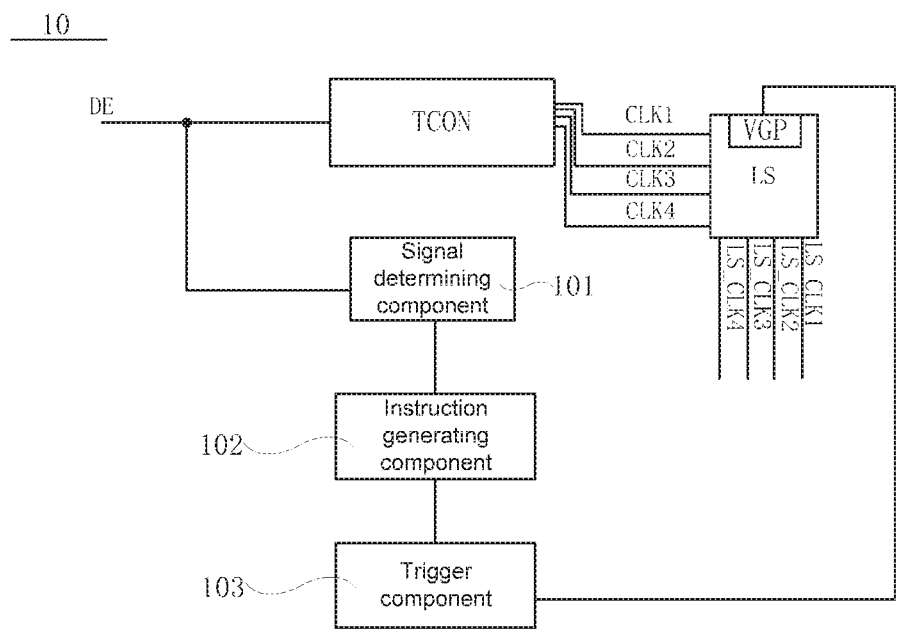
FIG. 2c is a schematic diagram showing a structure of the control sub-circuit in FIG. 2b.

In some embodiments, as shown in FIG. 2b or FIG. 2c, the control sub-circuit 10 further includes a signal determining component 101 and an instruction generating component 102.

The signal determining component 101 is configured to determine whether the DE is lost, for example, determining whether the DE is continuously a low-level signal for at least one period.

In some embodiments, the signal determining component 101 is a decoder in the TCON for decoding the DE. In the decoding process, the decoder may determine whether the DE signal is lost. In this case, the signal determining component 101 is integrated in the TCON.

In addition, the instruction generating component 102 is configured to receive the determination result from the signal determining component 101, and generate the first signal adjustment instruction described above when the signal determining component 101 determines that the DE is continuously a low-level signal for at least one period.

Based on this, in some embodiments, the instruction generating component 102 is further configured to generate a second signal adjustment instruction when the signal determining component 101 determines that DE is not continuously a low-level signal for at least one period.

In some embodiments, as shown in FIG. 2b or 2c, the control sub-circuit 10 further includes a trigger component 103 connected to the instruction generating component 102.

As shown in FIG. 2b, the trigger component 103 is also connected to a total reset terminal (TRST) connected to each stage of RS in the gate drive sub-circuit 20. The trigger component 103 is configured to provide a first enable signal to the TRST connected to each stage of RS in the gate drive sub-circuit 20 according to the first signal adjustment instruction, so as to further control each stage of RS to output the low-level signal as the disabling signal described above via its output terminal OUT.

In some embodiments, the trigger component 103 is connected to the charge sharing control terminal VGP of the LS. The trigger component 103 is configured to, according to the first signal adjustment instruction, control the LS to stop performing a charge sharing operation. In some embodiments, the trigger component 103 provides a second enable signal, such as a high level VGH, to the charge sharing control terminal VGP of the LS according to the first signal adjustment instruction generated by the instruction generating component 102, so that the LS stops performing the charge sharing operation.

In some embodiments, the trigger component 102 is configured to, when the DE signal returns to normal, control the LS to perform the charge sharing operation according to the second signal adjustment instruction generated by the instruction generating component 102, thereby reducing the power consumption when the initial clock signals (CLK1, CLK2, CLK3, CLK4, . . . ) are converted into a plurality of effective clock signals (GS_CLK1, GS_CLK2, GS_CLK3, GS_CLK4, . . . ).

Based on this, in order to improve the integration performance of electronic devices, in some embodiments, the instruction generating component 102 and the trigger component 102 described above are also integrated in the TCON.

Some embodiments of the present disclosure provide a method of controlling any one of the above display driving circuits. As shown in FIG. 2a, the display driving circuit 01 includes a control sub-circuit 10 and a gate drive sub-circuit 20 connected to the control sub-circuit 10.

Figure 3:
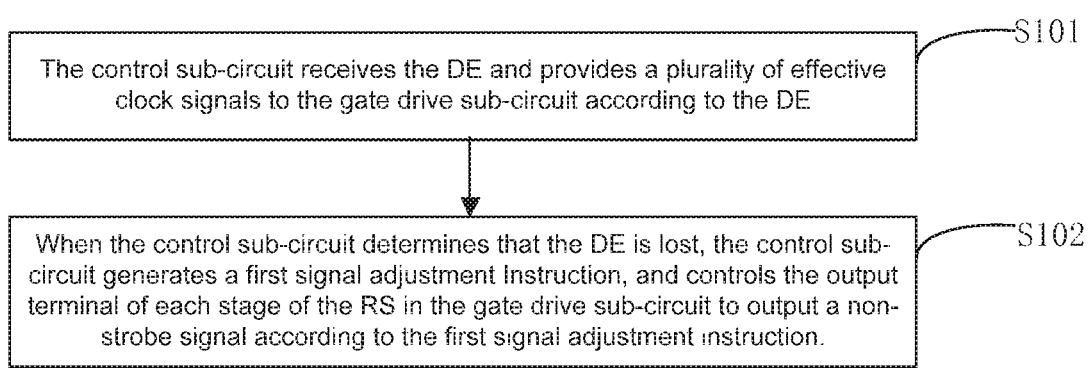
FIG. 3 is a flow diagram of a method of controlling a display driving circuit, in accordance with some embodiments of the present disclosure.

In this case, as shown in FIG. 3, the control method includes the following steps.

In S101, the control sub-circuit 10 receives the effective display data enable signal (DE), and provides a plurality of effective clock signals (GS_CLK1, GS_CLK2, GS_CLK3, GS_CLK4, . . . ) to the gate drive sub-circuit 20 according to the DE.

In some embodiments, as shown in FIG. 2a, the control sub-circuit 10 includes a TCON and an LS connected to the TCON. In this case, the above S101 includes the following sub-steps.

First, the TCON receives the DE, and outputs a plurality of initial clock signals (CLK1, CLK2, CLK3, CLK4, . . . ) to the LS according to the DE.

Next, the LS performs a charge sharing operation to convert a voltage of each of the plurality of initial clock signals (CLK1, CLK2, CLK3, CLK4, . . . ) into a medium voltage Vm, and then the Vm corresponding to each initial clock signal is converted into a voltage of an effective clock signal by, for example, a boost element, to obtain a plurality of effective clock signals (GS_CLK1, GS_CLK2, GS_CLK3, GS_CLK4, . . . ), achieving the increase of voltage amplitude of each of the plurality of initial clock signals (CLK1, CLK2, CLK3, CLK4, . . . ), thereby achieving the purpose of converting the plurality of initial clock signals into the plurality of effective clock signals (GS_CLK1, GS_CLK2, GS_CLK3, GS_CLK4, . . . ). In this case, the amplitude of each effective clock signal is greater than the amplitude of a corresponding initial clock signal.

In S102, the control sub-circuit 10 generates a first signal adjustment instruction when the control sub-circuit 10 determines that the DE is lost, and controls each stage of shift register (RS) in the gate drive sub-circuit 20 to output a disabling signal via an output terminal OUT of the stage of shift register according to the first signal adjustment instruction.

In this case, the gate line (Gate) connected to the RS receives the disabling signal, thereby in a state of not being gated.

The control sub-circuit 10 determines that the DE is lost, and generates a first signal adjustment instruction. For example, the control sub-circuit 10 determines that the DE is continuously a low-level signal for at least one period, and generates a first signal adjustment instruction.

In some embodiments, as shown in FIG. 2b or 2c, the control sub-circuit 10 includes a signal determining component 101, an instruction generating component 102, and a trigger component 103. Based on this, in a case where the signal determining component 101 is a decoder in the TCON, the signal determining component 101 can decode the DE input to the TCON. In the decoding process, the signal determining component 101 determines whether the DE signal is lost, and determines that the DE signal is lost when the DE is continuously a low-level signal for at least one period. The instruction generating component 102 is connected to the signal determining component 101, and the instruction generating component 102 generates a first signal adjustment instruction according to the determination result from the signal determining component 101. The trigger component 103 connected to the instruction generating component 102 receives the first signal adjustment instruction and controls each stage of RS in the gate drive sub-circuit 20 to output a disabling signal via an output terminal OUT of the stage of RS according to the first signal adjustment instruction.

The method of controlling the display driving circuit provided by some embodiments of the present disclosure has the same technical effects as the structure of the display driving circuit provided by the foregoing embodiments, which will not be described here again.

Hereinafter, in a case where the control sub-circuit 10 includes the TCON, the LS, the signal determining component 101, the instruction generating component 102 and the trigger component 103, the implementation process of the above S102 will be described in detail.

Figure 5:
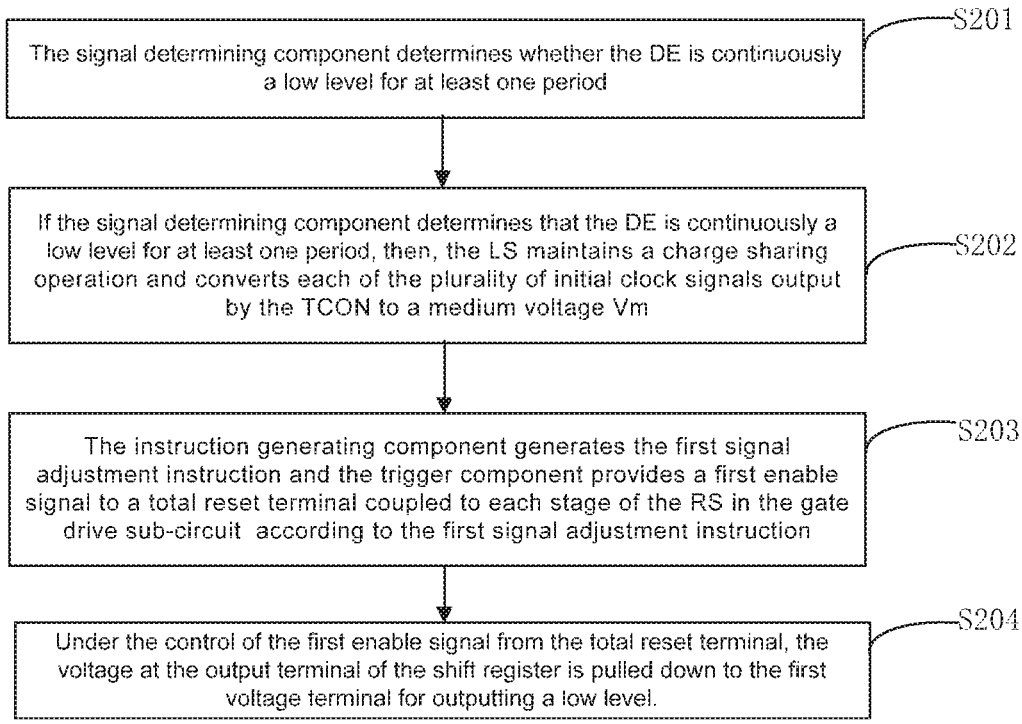
FIG. 5 is a flow diagram of an implementation process of the S102 in FIG. 3.

In some embodiments, in a case where the trigger component 103 is connected to a TRST of each stage of RS in the gate drive sub-circuit 20, the foregoing S102, as shown in FIG. 5, may include the following sub-steps.

In S201, the signal determining component 101 determines whether the DE is continuously a low-level signal for at least one period.

In S202, as shown in FIG. 4, when the signal determining component DE determines that the DE is continuously a low-level signal for at least one period, the LS maintains a charge sharing operation, and converts voltages of each of the plurality of initial clock signals (CLK1, CLK2, CLK3, CLK4, . . . ) output by the TCON into a medium voltage Vm. That is, in a period that the DE is lost, the LS converts voltages of each of the plurality of initial clock signals (CLK1, CLK2, CLK3, CLK4, . . . ) into the medium voltage Vm, and outputs the medium voltage Vm to the gate drive sub-circuit 20.

The medium voltage is greater than the trough voltage of the effective clock signal and less than the crest voltage of the effective clock signal.

In S203, the instruction generating component 102 generates the first signal adjustment instruction, as shown in FIG. 2b, and the trigger component 103 provides a first enable signal to the TRST connected to each stage of RS in the gate drive sub-circuit 20 according to the first signal adjustment instruction.

Based on this, the trigger component 103 may achieve a purpose of controlling each stage of RS in the gate drive sub-circuit 20 to output a disabling signal via the output terminal OUT according to the first signal adjustment instruction.

It will be noted that the first enable signal is used for turning on the TFT in the RS connected to the TRST. In this case, when the TFT is N-type, the first enable signal is a high-level signal VGH; when the TFT is P-type, the first enable signal is a low-level signal VGL. The embodiments of the present disclosure are described by taking an example in which the TFTs in the RS are all N-type.

In S204, under the control of the first enable signal from the TRST, a voltage at the output terminal OUT of the RS is pulled down to a first voltage terminal V1 used to output a low level VGL.

In this case, the disabling signal is a low-level signal output from the first voltage terminal V1.

In this case, the DE is continuously a low-level signal for at least one period. That is, after the DE is lost, the trigger element 103 in the TCON may output the first enable signal to the TRST, thereby further controlling of each stage of RS to output a low level as the above disabling signal via the output terminal OUT.

Figure 6:
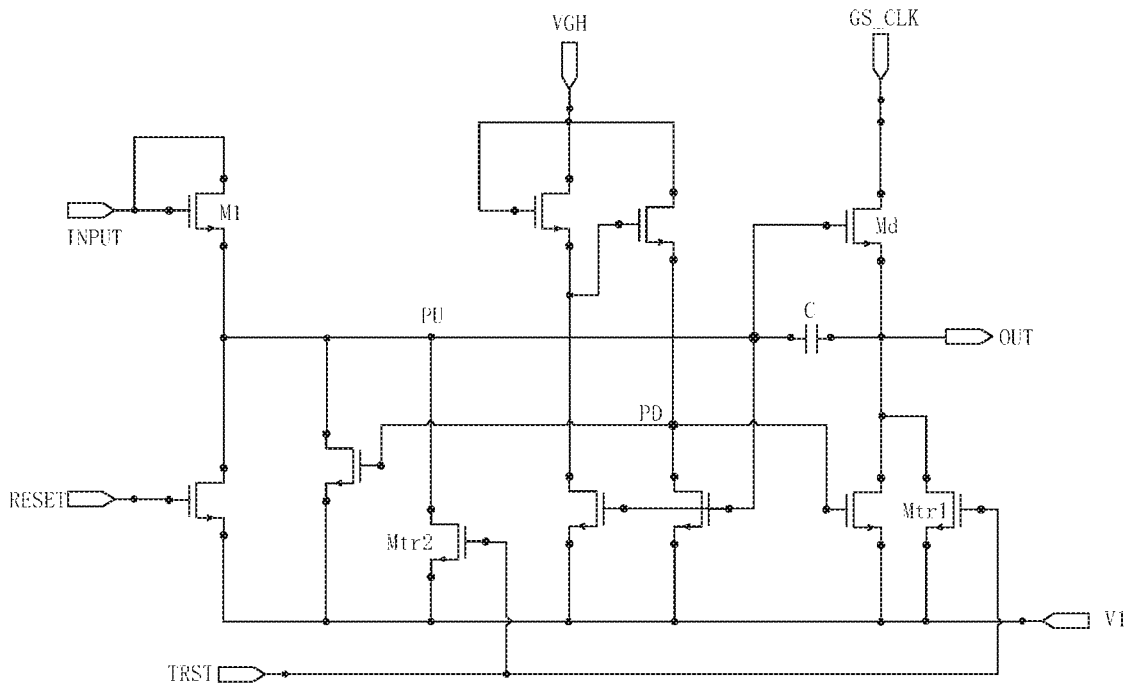
FIG. 6 is a schematic diagram showing a structure of a shift register, in accordance with some embodiments of the present disclosure.

In some embodiments, as shown in FIG. 6, the RS includes a first reset transistor Mtr1. A gate of the first reset transistor Mtr1 is connected to the TRST, a first electrode of the first reset transistor Mtr1 is connected to the output terminal OUT of the RS, and a second electrode of the first reset transistor Mtr1 is connected to the first voltage terminal V1.

Based on this, the above S203 includes the following process.

The first reset transistor Mtr1 is turned on under the control of the first enable signal from the TRST, and the output terminal OUT of the RS is connected to the first voltage terminal V1.

In this case, the signal of the output terminal OUT of the RS is pulled down to the first voltage terminal V1 through the turned-on first reset transistor Mtr1. In this case, the low level VGL may be output from the first voltage terminal V1. In this way, the signal received by the gate line connected to the output terminal OUT of the RS is a disabling signal. In this case, the TFTs in a row of the sub-pixels controlled by the gate line cannot be turned on. Therefore, the charges on the pixel electrodes of the row of the sub-pixels may not be quickly released, so that the row of the sub-pixels maintain the image in the previous frame.

Since all the RS are provided with the above TRST, the above disabling signal will be output from the output terminal OUT of each stage of RS, so that all the gate lines are in a state of not being gated. In this case, all of the sub-pixels maintain the display data in the previous frame for display, thereby solving a problem that the discharge of part of the sub-pixels causes a flash line on the display image.

In order to further improve the uniformity of the image after the DE is lost, in some embodiments, as shown in FIG. 6, the shift register further includes a second reset transistor Mtr2. A gate of the second reset transistor Mtr2 is connected to the TRST, a first electrode of the second reset transistor Mtr2 is connected to a pull-up node PU in the RS, and a second electrode of the second reset transistor Mtr2 is connected to the first voltage terminal V1. In this case, the method further includes: turning on the second reset transistor Mtr2 under the control of the first enable signal from the TRST, so that the pull-up node PU is connected to the first voltage terminal V1. In this way, the potential at the pull-up node PU is pulled down to the low level VGL of the first voltage terminal V1 through the turned-on second reset transistor Mtr2. In this case, it can be ensured that a driving transistor Md is in an off state, so that even if the LS performs a charge sharing operation, the medium voltage Vm output from the clock signal terminal GS_CLK cannot be transmitted to the output terminal OUT of the RS through the driving transistor Md, which enables to avoid the influence of the medium voltage Vm output from the clock signal terminal GS_CLK on the output signal of the output terminal OUT of the RS, thereby preventing the gate line connected to the output terminal OUT of the RS from being gated.

In some embodiments, the first electrodes of the first reset transistor Mtr1 and the second reset transistor Mtr2 are sources, and the second electrodes thereof may be drains. In some other embodiments, the first electrodes of the first reset transistor Mtr1 and the second reset transistor Mtr2 are drains, and the second electrodes thereof may be sources.

Figure 7:
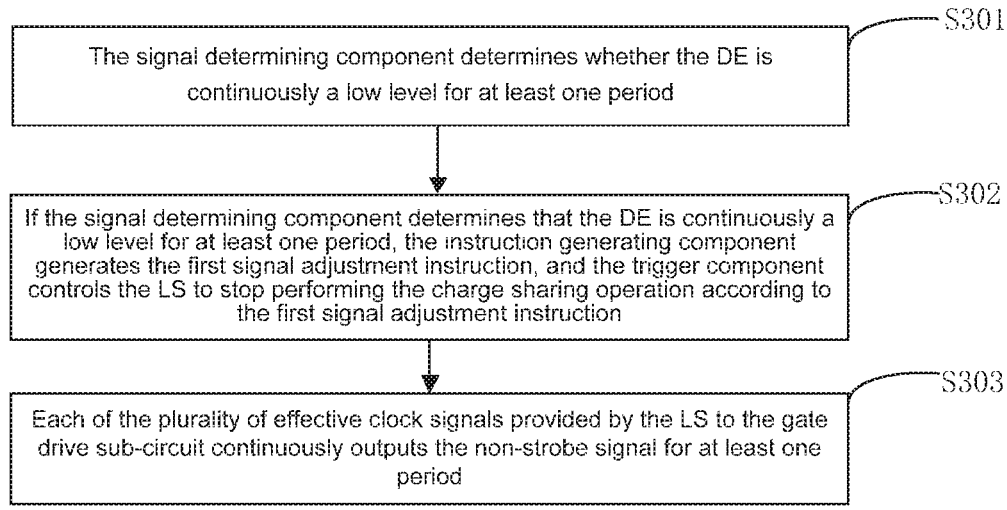
FIG. 7 is a flow diagram of another implementation process of the S102 in FIG. 3.

In some embodiments, in a case where the trigger component 103 is further connected to the charge sharing control terminal VGP of the LS, the implementation process of the above S102, as shown in FIG. 7, includes:

S301, determining, by the signal determining component 101, whether the DE is continuously a low-level signal for at least one period;

S302, generating, by the instruction generating component 102, a first signal adjustment instruction if the signal determining component 101 determines that DE is continuously a low-level signal VGL for at least one period, and controlling, by the trigger component 103, the LS to stop performing the charge sharing operation according to the first signal adjustment instruction; and S303, supplying, by the LS, a plurality of effective clock signals (GS_CLK1, GS_CLK2, GS_CLK3, GS_CLK4, . . . ) to the gate drive sub-circuit 20, each effective clock signal being continuously a disabling signal for at least one period. The disabling signal is, for example, a low-level signal VGL.

In some embodiments, the S301 includes: as shown in FIG. 2c, if the DE is continuously a low-level signal VGL for at least one period, providing, by the trigger component 103, a second enable signal to the charge sharing control terminal VGP of the LS according to the first signal adjustment instruction generated by the instruction generating component 102; receiving, by the LS, a second enable signal at the charge sharing control terminal VGP; and stopping, by the LS, performing the charge sharing operation under the control of the second enable signal from the charge sharing control terminal VGP. Thereby the trigger component 103 achieves a purpose of controlling each stage of RS in the gate drive sub-circuit 20 to output a disabling signal via the output terminal OUT according to the first signal adjustment instruction. In this way, only by providing the second enable signal to the charge sharing control terminal VGP of the LS, can the LS stop performing the charge sharing operation under the control of the charge sharing control terminal VGP. Therefore, it is not necessary to separately set a circuit structure for controlling the LS to stop performing the charge sharing operation, so that the control method and the structure of the entire display driving circuit may be simplified.

Figure 8:
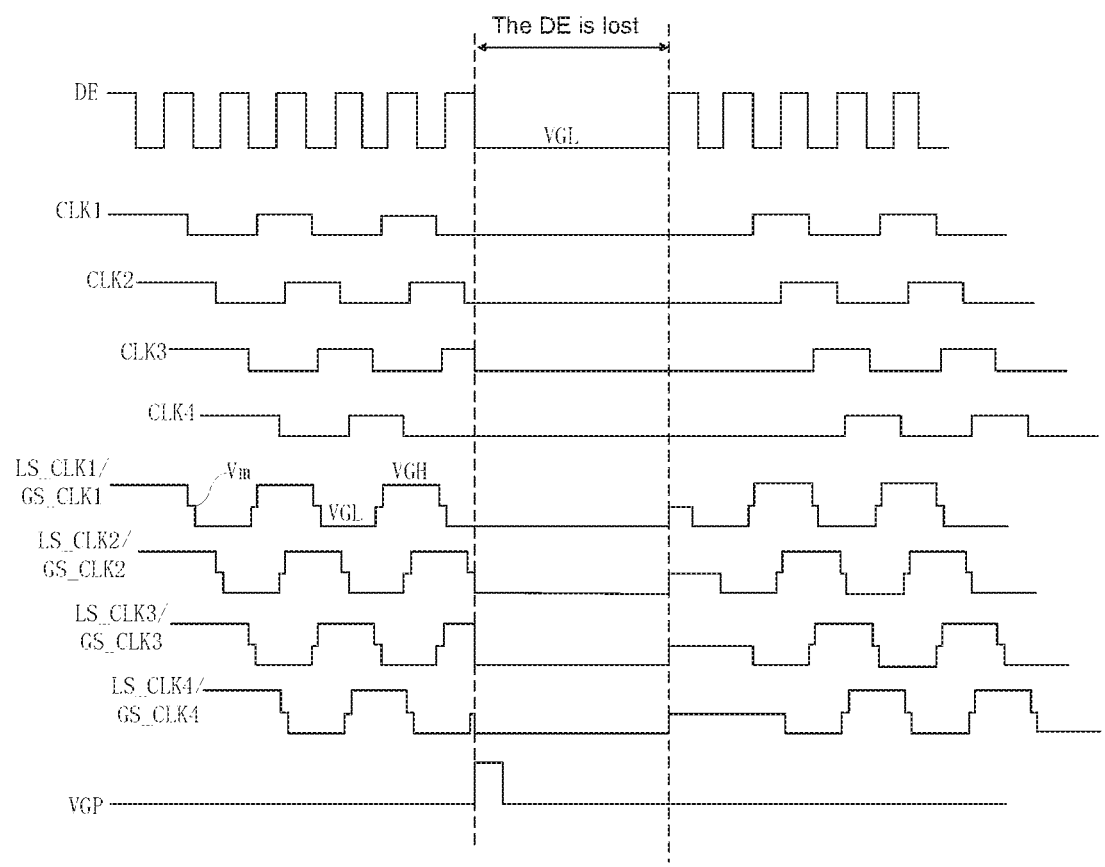
FIG. 8 is another timing diagram of signals involved in the S102 of FIG. 3.

In some embodiments, as shown in FIG. 8, the second enable signal received by the LS via the charge sharing control terminal VGP may be a high-level signal VGH.

It can be seen from the above that after the DE signal is lost, the LS may be controlled to stop performing the charge sharing operation through the charge sharing control terminal VGP of the LS. In this way, as shown in FIG. 8, each of the plurality of effective clock signals (GS_CLK1, GS_CLK2, GS_CLK3, GS_CLK4, . . . ) may follow the variation of the DE, and then is converted into a low level. The low level is supplied as a disabling signal to the gate line connected to the output terminal OUT of the RS, and in this case, the TFTs of a row of sub-pixels controlled by the gate line cannot be turned on. Therefore, the charges on the pixel electrodes of the row of sub-pixels may not be quickly released, so that the the row of sub-pixels maintain the image in the previous frame.

After the LS stops performing the charge sharing operation, the initial clock signals (CLK1, CLK2, CLK3, CLK4, . . . ) will directly be converted into the effective clock signals (GS_CLK1, GS_CLK2, GS_CLK3, GS_CLK4, . . . ) without going through the medium voltage Vm. The scheme can be adopted without considering the influence of power consumption.

In some embodiments, after the DE signal returns to normal, that is, the signal determining component 101 determines that the DE is not continuously a low-level signal for at least one period, the control sub-circuit 10 controls the LS to perform the above charge sharing operation to reduce the power consumption in the conversion process of the initial clock signals (CLK1, CLK2, CLK3, CLK4, . . . ) to the effective clock signals (GS_CLK1, GS_CLK2, GS_CLK3, GS_CLK4, . . . ).

Based on this, in order to achieve the purpose of reducing power consumption, in some embodiments, the method further includes:

determining, by the signal determining component 101, whether the DE is continuously a low-level signal for at least one period, and generating, by the instruction generating component 102, a second signal adjustment instruction if the signal determining component 101 determines that the DE is not continuously a low-level signal for at least one period, and controlling, by the trigger component 103, the LS to perform the charge sharing operation described above according to the second signal adjustment instruction.

Figure 2D:
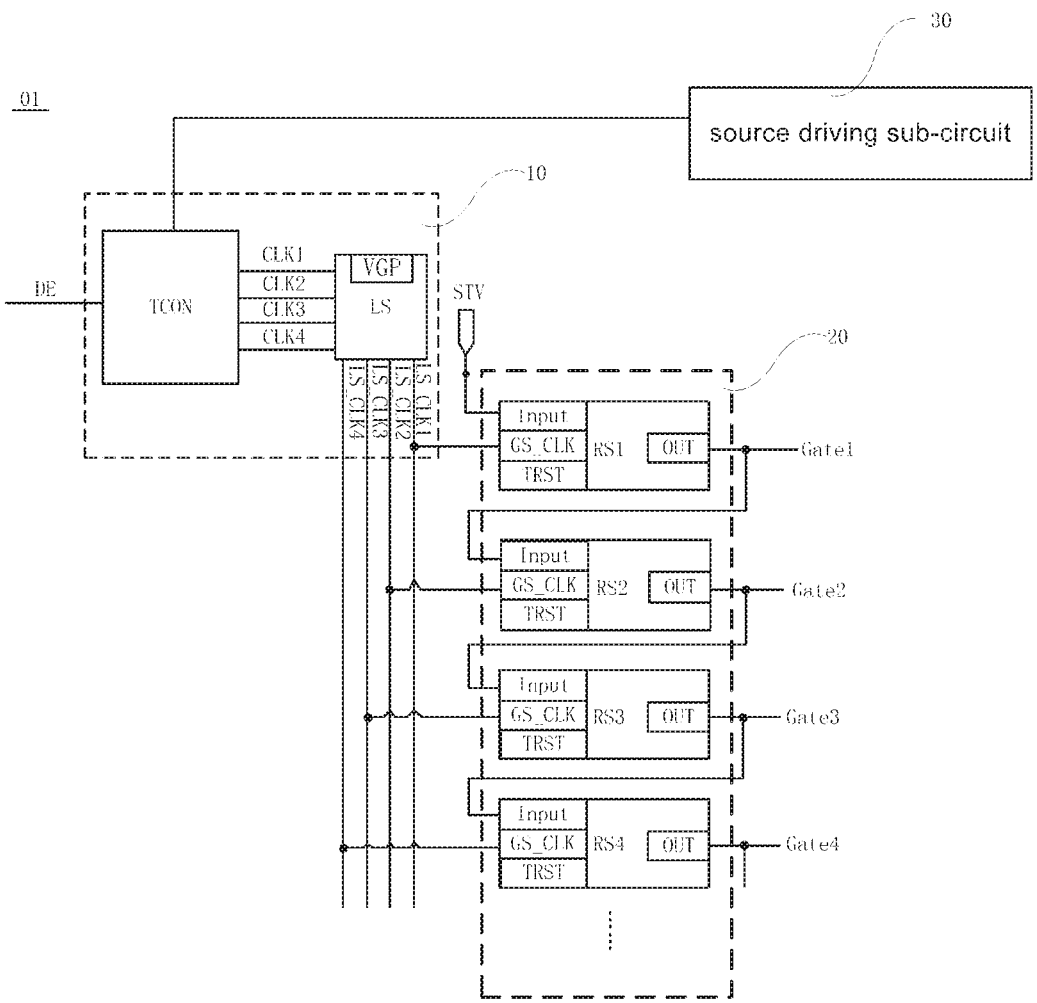
FIG. 2d is a schematic diagram showing a structure of yet another display driving circuit, in accordance with some embodiments of the present disclosure.

In some embodiments, as shown in FIG. 2d, the display driving circuit described above further includes a source drive sub-circuit 30 connected to the TCON. Based on this, when the DE is continuously a low level VGL for at least one period, the TCON enters a mute mode, so that the TCON may output a data voltage Vdata for displaying a black image to the source drive sub-circuit 30. In this way, the power consumption of the source drive sub-circuit 30 may be reduced.

When the DE returns to normal, the TCON switches from the mute mode back to the normal mode, and the source drive sub-circuit 30 outputs the data voltage Vdata for normal display. In this case, in any one of the control methods corresponding to FIG. 4 or 8, after the DE returns to normal, that is, after the DE is not continuously a low-level signal for at least one period, and when the DE is a normal square wave signal, the method further includes:

outputting, by the control sub-circuit 10, a start signal STV to the input terminal Input of a first-stage RS in the gate drive sub-circuit 20. In this case, in a plurality of cascaded RSs in the gate drive sub-circuit 20, the first-stage RS may be the first one to perform a shift register function. In this way, the gate lines in the display panel are scanned row by row from the beginning to display a new frame of image.

Some embodiments of the present disclosure provide a computer device including a memory and a processor. The memory stores a computer program executable on the processor, and the processor implements any one of the methods described above when executing the computer program. The computer device has the same technical effects as the control methods provided by the above embodiments, which will not be described herein again.

In some embodiments, the above memory includes various media that can store program codes, such as a ROM, a RAM, a magnetic disk, or an optical disk.

Some embodiments of the present disclosure provide a computer readable medium storing a computer program that, when is executed by the processor, performs any one of the methods described above. The computer readable medium has the same technical effects as the control methods provided by the above embodiments, which will not be described herein again.

Some embodiments of the present disclosure provide a display apparatus including any one of the display driving circuits described above. The display apparatus has the same technical effects as the display driving circuit provided by the above embodiments, which will not be described herein again.

The display apparatus includes a display panel. In some embodiments, the display driving circuit described above is directly manufactured in a non-display area of the display panel by a patterning process (e.g., a mask process). In some other embodiments, the display driving circuit described above is integrated in a chip, and then the chip is bonded to the display panel. The manner in which the above display driving circuit is provided is not limited in the present disclosure, but is within the protection scope of the present disclosure.

The display apparatus may be a liquid crystal display apparatus or an organic light-emitting diode display apparatus. For example, the display apparatus may be any product or component having a display function such as a display, a television, a digital photo frame, a mobile phone, or a tablet computer.

The foregoing descriptions are merely some implementation manners of the present disclosure, but the protection scope of the present disclosure is not limited thereto. The changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A display driving circuit, comprising a control sub-circuit and a gate drive sub-circuit connected to the control sub-circuit, wherein
the control sub-circuit is configured to:
receive an effective display data enable signal;
determine whether the effective display data enable signal is lost; and
control each stage of shift register in the gate drive sub-circuit to output a disabling signal via an output terminal of the shift register in response to determining that the effective display data enable signal is lost, a gate line that receives the disabling signal being in a state of not being gated;
wherein the control sub-circuit includes a signal determining component, an instruction generating component connected to the signal determining component, and a trigger component connected to the instruction generating component, and the trigger component is further connected to a total reset terminal connected to each stage of shift register in the gate drive sub-circuit;
the signal determining component is configured to determine whether the effective display data enable signal is lost;
the instruction generating component is configured to receive a determination result from the signal determining component, and generate the first signal adjustment instruction in response to the signal determining component determining that the effective display data enable signal is lost;
the trigger component is configured to provide a first enable signal to the total reset terminal connected to the shift register in the gate drive sub-circuit according to the first signal adjustment instruction; and
the shifter register is configured to output the disabling signal via an output terminal of the shifter register under control of the first enable signal;
wherein the control circuit further includes a timing controller and a level shifter connected to the timing controller;
the instruction generating component is further configured to generate a second signal adjustment instruction in response to the signal determining component determining that the effective display data enable signal is not lost;
the timing controller is configured to receive the effective display data enable signal, and output a plurality of initial clock signals to the level shifter according to the effective display data enable signal; and the level shifter is configured to convert the plurality of initial clock signals into a plurality of first effective clock signals according to the second signal adjustment instruction, and an amplitude of each of the plurality of initial clock signals is less than an amplitude of each converted first effective clock signal.

2. The display driving circuit according to claim 1, wherein the signal determining component, the instruction generating component, and the trigger component are integrated in the timing controller.

3. A display apparatus, comprising the display driving circuit according to claim 1.

4. The display driving circuit according to claim 1, wherein the level shifter is configured to convert the plurality of initial clock signals into a medium voltage signal, and then convert the medium voltage signal into the plurality of first effective clock signals, an amplitude of the medium voltage signal is greater than a minimum amplitude of the first effective clock signals, and less than a maximum amplitude of the first effective clock signals.

5. The display driving circuit according to claim 1, wherein the control sub-circuit includes a timing controller and a level shifter connected to the timing controller;
the timing controller is configured to receive the effective display data enable signal, and output a plurality of initial clock signals to the level shifter according to the effective display data enable signal; and
the level shifter is configured to convert the plurality of initial clock signals into a plurality of second effective clock signals.

6. The display driving circuit according to claim 1, wherein the shifter register includes a first reset transistor, a gate of the first reset transistor is connected to the total reset terminal, a first electrode of the first reset transistor is connected to the output terminal, and a second electrode of the first reset transistor is connected to a first voltage terminal;
the first reset transistor is configured to transmit the disabling signal received by the first voltage terminal to the output terminal under control of the first enable signal.

7. The display driving circuit according to claim 6, wherein the shifter register further includes a second reset transistor and a driving transistor, a gate of the second reset transistor is connected to the total reset terminal, a first electrode of the second reset transistor is connected to a pull-up node in the shifter register, a second electrode of the second reset transistor is connected to the first voltage terminal, and a gate of the driving transistor is connected to the pull-up node;
the second reset transistor is configured to transmit the disabling signal received by the first voltage terminal to the pull-up node under the control of the first enable signal; and
the driving transistor is configured to be turned off under control of the disabling signal from the pull-up node.

8. A method of controlling a display driving circuit, the display driving circuit including a control sub-circuit and a gate drive sub-circuit connected to the control sub-circuit, wherein
the control sub-circuit is configured to: receive an effective display data enable signal; determine whether the effective display data enable signal is lost; and control each stage of shift register in the gate drive sub-circuit to output a disabling signal via an output terminal of the shift register in response to determining that the effective display data enable signal is lost;

wherein the method comprises:
receiving, by the control sub-circuit, the effective display data enable signal;
determining, by the control sub-circuit, whether the effective display data enable signal is lost; and
controlling, by the control sub-circuit, each stage of shift register in the gate drive sub-circuit to output a disabling signal via an output terminal of the shift register in response to determining that the effective display data enable signal is lost, a gate line that receives the disabling signal being in a state of not being gated;
wherein the control sub-circuit includes a timing controller, a level shifter, a signal determining component, an instruction generating component, and a trigger component;
determining, by the control sub-circuit, whether the effective display data enable signal is lost; and controlling, by the control sub-circuit, each stage of shift register in the gate drive sub-circuit to output a disabling signal via an output terminal of the shift register in response to determining that the effective display data enable signal is lost, includes:
determining, by the signal determining component, whether the effective display data enable signal is continuously a low level for at least one period;
generating, by the instruction generating component, a first signal adjustment instruction, if the signal determining component determines that the effective display data enable signal is continuously a low level for at least one period;
providing, by the trigger component, a first enable signal to a total reset terminal connected to each stage of shift register in the gate drive sub-circuit according to the first signal adjustment instruction; and
pulling down a voltage at the output terminal of the stage of shift register to a first voltage terminal used to output a low level, under control of the first enable signal from the total reset terminal;
wherein the method further comprises:
generating, by the instruction generating component, a second signal adjustment instruction if the signal determining component determines that the effective display data enable signal is not continuously a low level for at least one period;
converting, by the level shifter, a plurality of initial clock signals output by the timing controller into a plurality of first effective clock signals according to the second signal adjustment instruction, an amplitude of each of the plurality of initial clock signals being less than an amplitude of each converted first effective clock signal.

9. The method of controlling the display driving circuit according to claim 8, wherein after the effective display data enable signal is continuously a low level for at least one period, and when the effective display data enable signal is a square wave signal, the method further comprises:
outputting, by the control sub-circuit, a start signal to an input terminal of a first-stage shift register of the gate drive sub-circuit.

10. The method of controlling the display driving circuit according to claim 8, wherein
determining, by the control sub-circuit, whether the effective display data enable signal is lost and controlling, by the control sub-circuit, each stage of shift register in the gate drive sub-circuit to output a disabling signal via an output terminal of the shift register in response to determining that the effective display data enable signal is lost, further includes:

controlling, by the trigger component, the level shifter to stop performing a charge sharing operation, according to the first signal adjustment instruction, wherein each of a plurality of effective clock signals provided by the level shifter to the gate drive sub-circuit is continuously a disabling signal for at least one period.

11. The method of controlling the display driving circuit according to claim 10, wherein the method further comprises: controlling, by the trigger component, the level shifter to perform a charge sharing operation according to the second signal adjustment instruction.

12. The method of controlling the display driving circuit according to claim 10, wherein controlling the level shifter to stop performing a charge sharing operation, includes:
receiving, by a charge sharing control terminal of the level shifter, a second enable signal, and stopping, by the level shifter, performing a charge sharing operation under control of the second enable signal from the charge sharing control terminal.

13. The method of controlling the display driving circuit according to claim 8, wherein
determining, by the control sub-circuit, whether the effective display data enable signal is lost; and controlling, by the control sub-circuit, each stage of shift register in the gate drive sub-circuit to output a disabling signal via an output terminal of the stage of shift register in response to determining that the effective display data enable signal is lost, further includes:
maintaining, by the level shifter, a charge sharing operation if the signal determining component determines that the effective display data enable signal is continuously a low level for at least one period, and converting, by the level shifter, each of the plurality of initial clock signals output by the timing controller to a medium voltage, which is greater than a trough voltage of each effective clock signal and less than a crest voltage of the effective clock signal.

14. The method of controlling the display driving circuit according to claim 13, wherein the display driving circuit further includes a source drive sub-circuit connected to the timing controller; and
when the effective display data enable signal is continuously a low level for at least one period, the method further comprises: outputting, by the timing controller, a data voltage for displaying a black image to the source drive sub-circuit.

15. The method of controlling the display driving circuit according to claim 13, wherein the shift register includes a first reset transistor, a gate of the first reset transistor is connected to the total reset terminal, a first electrode of the first reset transistor is connected to the output terminal of the shift register, and a second electrode of the first reset transistor is connected to the first voltage terminal; and
pulling down a voltage at the output terminal of the shift register to a first voltage terminal used to output a low level, under the control of the first enable signal from the total reset terminal, includes: turning on the first reset transistor under the control of the first enable signal from the total reset terminal, so that the output terminal of the shift register is electrically connected to the first voltage terminal.

16. The method of controlling the display driving circuit according to claim 15, wherein the shift register further includes a second reset transistor; a gate of the second reset transistor is connected to the total reset terminal, a first electrode of the second reset transistor is connected to a pull-up node in the shift register, and a second electrode of the second reset transistor is connected to the first voltage terminal; the method further comprises: turning on the second reset transistor under the control of the first enable signal from the total reset terminal, so that the pull-up node is electrically connected to the first voltage terminal.

17. A computer device, comprising a memory and a processor, wherein the memory stores a computer program executable on the processor, and when the processor executes the computer program, the method of controlling the display driving circuit according to claim 8 is implemented.

* * * * *